United States Patent [19]

Sato

[11] Patent Number: 5,373,185
[45] Date of Patent: Dec. 13, 1994

[54] MULTILAYER VERTICAL TRANSISTOR HAVING AN OVERLAY ELECTRODE CONNECTED TO THE TOP LAYER OF THE TRANSISTOR AND TO THE TRANSISTOR SUBSTRATE

[75] Inventor: Hiroya Sato, Tenri, Japan

[73] Assignee: Sharp Kabushiki Kaisha, Osaka, Japan

[21] Appl. No.: 121,500

[22] Filed: Sep. 16, 1993

[30] Foreign Application Priority Data

Sep. 18, 1992 [JP] Japan .................. 4-249400

[51] Int. Cl.⁵ .................. H01L 29/70; H01L 29/52; H01L 29/54
[52] U.S. Cl. .................. 257/587; 257/579; 257/584
[58] Field of Search .............. 257/197, 198, 565, 578, 257/579, 584, 587, 734, 712, 776

[56] References Cited

U.S. PATENT DOCUMENTS

| 4,918,514 | 4/1990 | Matsuda | 257/584 |
| 5,084,750 | 1/1992 | Adlerstein | 257/197 |
| 5,097,312 | 3/1992 | Bayraktaroglu | 257/197 |

FOREIGN PATENT DOCUMENTS 0003335 1/1991 Japan.

OTHER PUBLICATIONS

Sheng et al., High Power GaAlAs/GaAs HBTs For Microwave Applications, IEDM Digest 1987 pp. 619–622.
Wargin, Dr. et al. Microwave Bipolar Linear Power Transistors Communications International (GB), vol. 6, No. 9, Sept. 1979, pp. 20–24.
Sato et al.; Technical Research Report ED 90-135; Jan./1991; "Carbon-Doped AlGaAs/GaAs HBTs . . . "; pp. 19-24 (partial English translation).
Mishra et al.; IEDM 88 Technical Digest; Dec./1988; "48 GHz AlInAs/GaInAs Heterojunction . . . "; pp. 873-875.
Prasad et al.; GaAs IC Symposium; 1991; "A 45 GHz AlGaAs/GaAs HBT IC Technology"; pp. 121-124.

Primary Examiner—Rolf Hille
Assistant Examiner—Peter Toby Brown
Attorney, Agent, or Firm—Nixon & Vanderhye

[57] ABSTRACT

A vertical type construction transistor of this invention includes: a semiconductor substrate; a semiconductor multilayer formed on the semiconductor substrate, the semiconductor multilayer including at least an emitter layer, a collector layer, and a base layer; a first electrode electrically connected to the base layer; a second electrode electrically connected to one of the emitter layer and the collector layer; a third electrode formed on the semiconductor multilayer, and electrically connected to the other of the emitter layer and the collector layer, the third electrode being extended in a first direction; an insulating film formed substantially over the semiconductor multilayer; and an overlay electrode at least partially formed on the insulating film, the overlay electrode being electrically connected to the third electrode, at least partially formed on the insulating film, and extending out in a direction normal to the first direction so as to be in partial contact with the semiconductor substrate, the overlay electrode having a width substantially similar to the length of the third electrode in the first direction.

8 Claims, 5 Drawing Sheets

MULTILAYER VERTICAL TRANSISTOR HAVING AN OVERLAY ELECTRODE CONNECTED TO THE TOP LAYER OF THE TRANSISTOR AND TO THE TRANSISTOR SUBSTRATE

This application is related to commonly assigned copending applications 07/925,785 filed Aug. 7, 1992 to Sato et al. and 07/907,614 filed Jul. 2, 1992 to Sato.

BACKGROUND OF THE INVENTION

1. Field of the Invention:

The present invention relates to a vertical type construction transistor.

2. Description of the Related Art:

With the development of an epitaxial growth method for a compound semiconductor layer, there has arisen a demand for a further improved vertical type construction transistor including a semiconductor heterojunction. As a heterojunction bipolar transistor (HBT), one kind of vertical type construction transistor, operates with high current density, it should be made so that the generated heat can be dissipated to the outside.

FIG. 4A is a plan view showing a structure for conventional vertical type construction transistors 23. FIG. 4B is a cross-sectional view taken along the line of 4B-4B of FIG. 4A. Each vertical type transistor 23 has a collector layer 24 formed on a semiconductor substrate 20 including a sub-collector layer, a base layer 21 formed on the collector layer 24, and emitter layer 22 formed on the base layer 21. A finger-shaped emitter electrode 1 and a finger-shaped base electrode 2 are formed on the emitter layer 22 and the base layer 21, respectively. A collector electrode 3 is formed on the semiconductor substrate 20. The emitter electrode 1 and the base electrode 2 are extended from the opposite side to each other so as to be in parallel with each other. The emitter electrode 1 and the base electrode 2 are connected to an emitter lead electrode 11 and a base lead electrode 12, respectively. The collector electrode 3 is connected to a collector lead electrode 13. The emitter lead electrode 11 is further connected to emitter electrodes of the adjacent vertical type construction transistors 23, and the collector lead electrode 13 is further connected to a collector electrode 3 of the adjacent vertical type construction transistor 23.

According to the vertical type construction transistor 23, remarkably high heat is generated at a junction portion between the collector layer 24 and the base layer 21. A via hole is provided so as to extend through the emitter lead electrode 11 from the reverse face side of the semiconductor substrate 20, and then a metal excellent in thermal conductivity is buried into the via hole 4, so that the generated heat can be dissipated to the outside from the reverse face side of the semiconductor substrate 20 through the emitter electrode 1 and the emitter lead electrode 11. However, according to such a structure, the generated heat cannot be effectively dissipated to the outside, so that the vertical type construction transistor 23 inevitably has high thermal resistance. Moreover, since the emitter lead electrode 11 is formed into a narrow-strip shape, the emitter inductance becomes large during the operation in a high frequency band, thereby lowering the gain. As many problems such as those are caused, conventionally the vertical type construction transistor could not be put to practical use in the high frequency band.

FIG. 5 shows a cross-sectional view of another conventional vertical type construction transistors 25. Each vertical type transistor 25 has a collector layer 24 formed on a semiconductor substrate 20 including a sub-collector layer, a base layer 21 formed on the collector layer 24, and emitter layer 22 formed on the base layer 21. A finger-shaped emitter electrode 1 and a finger-shaped base electrode 2 are formed on the emitter layer 22 and the base layer 21, respectively. A collector electrode 3 is formed on the semiconductor substrate 20. The collector electrodes 3 of the adjacent vertical type construction transistors 23 are each connected to a common collector lead electrode 13, which is arranged in the air so as to cross over the emitter electrodes 1 and the base electrodes 2 by using an air-bridge technique.

Due to such a structure for the collector lead electrode 13, parasitic capacitance $C_{BC}$ between base/collector is increased, so that the characteristics of the vertical type construction transistor 23 are deteriorated in the high frequency band. In addition, it is difficult to form the collector lead electrode 13 in an arched shape so as to cross over the emitter electrodes 1, which results in a low production yield and a high production cost. Moreover, the emitter electrode 1 should be made thin so as not to contact with the collector lead electrode 13, and therefore operation errors will be likely to occur. Furthermore, even when the heat of the junction portion between the emitter layer 22 and the base layer 21 is dissipated through the emitter electrode 1, the heat cannot be dissipated to the outside but rather confined in a space 5 defined by the collector lead electrode 13 formed above the emitter electrode 1.

Accordingly, the present invention has been developed with a view to substantially eliminating the above discussed drawbacks inherent in the conventional vertical type construction transistor. The objective of the present invention is to provide an improved vertical type construction transistor, especially a vertical type construction transistor to be operated at high speed in the high frequency band, by forming lead electrodes which can effectively dissipate the heat of the junction portion, and provide low inductance during high frequency operation. Therefore, the vertical type construction transistor of the present invention can be put to practical use as a power amplification use in the microwave band.

SUMMARY OF THE INVENTION

The vertical type construction transistor of this invention includes: a semiconductor substrate; a semiconductor multilayer formed on the semiconductor substrate, the semiconductor multilayer including at least an emitter layer, a collector layer, and a base layer; a first electrode electrically connected to the base layer; a second electrode electrically connected to one of the emitter layer and the collector layer; a third electrode formed on the semiconductor multilayer, and electrically connected to the other of the emitter layer and the collector layer, the third electrode being extended in a first direction; an insulating film formed substantially over the semiconductor multilayer; and an overlay electrode at least partially formed on the insulating film, the overlay electrode being electrically connected to the third electrode, at least partially formed on the insulating film, and extending out in a direction normal to the first direction so as to be in partial contact with the semiconductor substrate, the overlay electrode having a width substantially similar to the length of the third electrode in the first direction.

According to another aspect of the invention, a semiconductor device is provided. The semiconductor device includes: a semiconductor substrate; a plurality of vertical type construction transistors formed on the semiconductor substrate, each including: a semiconductor multilayer formed on the semiconductor substrate, the semiconductor multilayer including at least an emitter layer, a collector layer, and a base layer, a first electrode being electrically connected to the base layer, a second electrode being electrically connected to one of the emitter layer and the collector layer, a third electrode formed on the semiconductor multilayer, and electrically connected to the other of the emitter layer and the collector layer not being electrically connected to the second electrode, the third electrode being extended in a first direction, and an insulating film formed substantially over the semiconductor multilayer; a first lead electrode formed on the semiconductor substrate for electrically connecting the first electrodes of the plurality of vertical type construction transistors to each other; a second lead electrode formed on the semiconductor substrate for electrically connecting the second electrodes of the plurality of vertical type construction transistors to each other; and an overlay electrode at least partially formed on the insulating film, the overlay electrode being electrically connected to the third electrode, at least partially formed on the insulating film, and extending out in a direction normal to the first direction so as to be in partial contact with the semiconductor substrate, the overlay electrode having a width substantially similar to the length of the third electrode in the first direction.

Thus, the invention described herein makes possible the advantage of providing a vertical type construction transistor which can be put to practical use as a power amplification use in the microwave band by effectively radiating the heat of the semiconductor layer from the overlay electrode which is extended out above the semiconductor layer in an arched shape centering around the portion corresponding to the center of the semiconductor layer, and making the thickness of the overlay electrode large enough to reduce the inductance of the overlay electrode.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrating examples.

Figure 1:
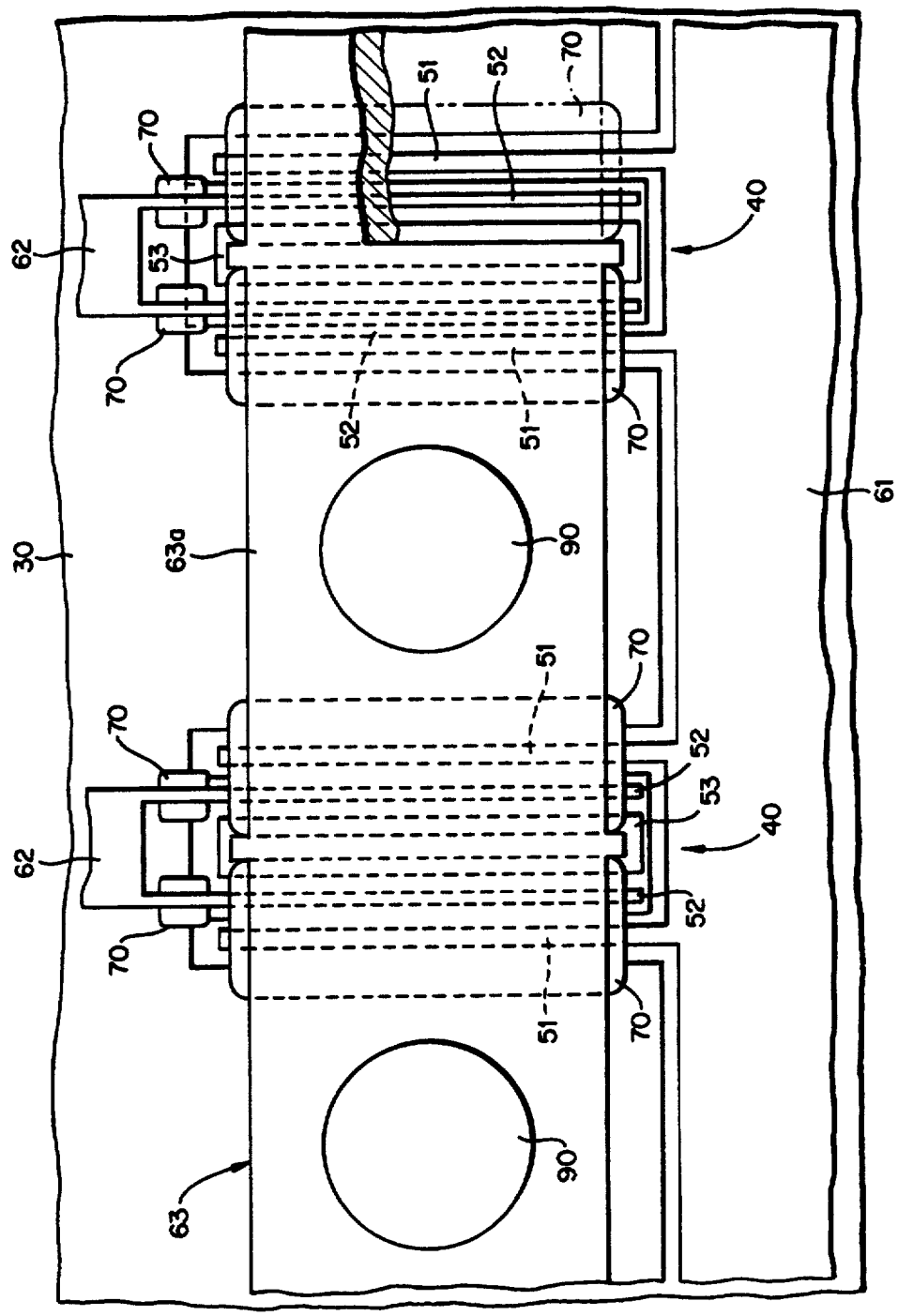
FIG. 1 is a plan view showing a structure for vertical type construction transistors according to the present invention.
Figure 2:
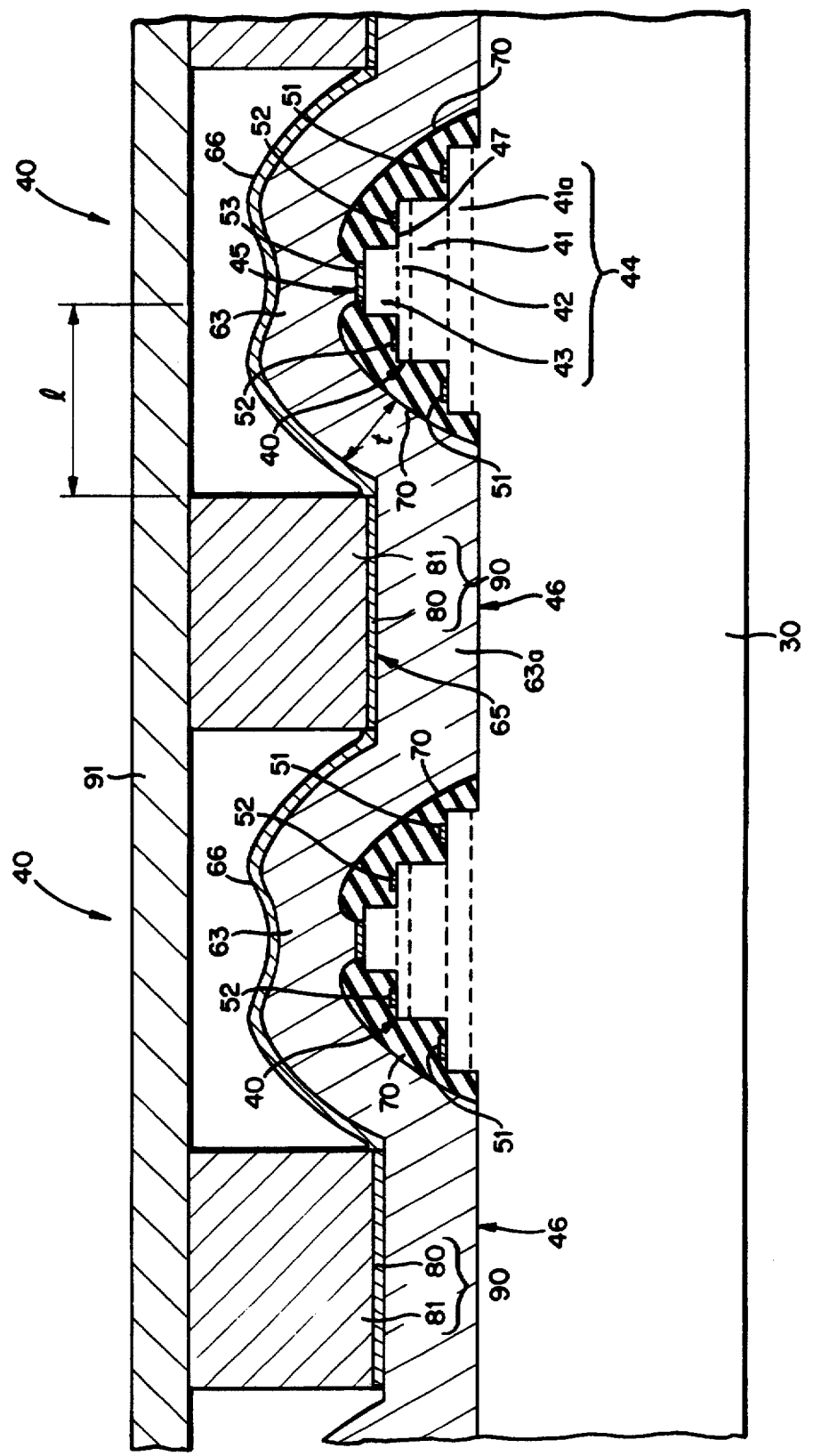
FIG. 2 is a cross-sectional view of FIG. 1.

FIG. 1 is a plan view showing a structure for a plurality of vertical type construction transistors 40 on a semiconductor substrate 30 according to the present invention. The plurality of the vertical type construction transistors 40 are electrically connected in parallel with each other. Each vertical type construction transistor 40 is an npn-type heterojunction bipolar transistor (HBT) for power amplification use in the microwave band. FIG. 2 is a cross-sectional view of the HBT 40.

A semiconductor multilayer 44 is formed on the semiconductor substrate 30. The semiconductor multilayer 44 consists of a sub-collector layer 41a formed on the semiconductor substrate 30, a collector layer 41 formed on the sub-collector layer 41a, a base layer 42 formed on the collector layer 41, and an emitter layer 43 formed on the base layer 42. The emitter layer 43 is the uppermost layer of the semiconductor multilayer 44. A base/collector junction is formed at the interface between the collector layer 41 and the base layer 42, and a base/emitter junction is formed at the interface between the base layer 42 and the emitter layer 43.

A finger-shaped collector electrode 51 as a second electrode is formed on the sub-collector layer 41a. An n-type impurity is doped into the sub-collector layer 41a at high concentration so that the collector layer 41 is electrically connected to the collector electrode 51 with low resistance, and thus the collector layer 41 is electrically connected to the collector electrode 51 through the sub-collector layer 41a. Accordingly, the sub-collector layer 41a and the collector layer 41 can substantially be regarded as a single collector layer. A finger-shaped base electrode 52 as a first electrode is formed on the base layer 42. An emitter electrode 52 as a third electrode is formed on the emitter layer 43. The collector electrode 51, the base electrode 52, and the emitter electrode 53 are extended in a first direction in parallel with one another.

The collector electrode 51 is connected to the collector lead electrode 61 formed on the semiconductor substrate 30. The base electrode 52 is connected to the base lead electrode 62 formed on the semiconductor substrate 30. An insulating film 70 is arranged below the base electrode 52 and the base lead electrode 62 so that the base electrode 52 is not electrically in contact with the collector layer 41 and the sub-collector layer 41a.

The emitter lead electrode 63 as an overlay electrode is extended out in an arched shape centering around the portion corresponding to the emitter electrode 53 in a direction normal to the first direction. The emitter lead electrode 63 is formed so as to cross over the base electrode 52 and the collector electrode 51, and partially contact with the semiconductor substrate 30 at a portion 63a. The width of the emitter lead electrode 63 is in substantial conformity with the length of the emitter electrode 53, so that the emitter lead electrode 63 covers the collector layer 41, the base layer 42, and the emitter layer 43 which substantially function as transistors. An insulating film 70 is filled in the space between these semiconductor layers and the emitter lead electrode 63, which insulates the emitter lead electrode 63 from these semiconductor layers, the base electrode 52, and the collector electrode 51, as well as holds the emitter lead electrode 63.

A bump electrode 90 composed of a titanium film 80 and a gold film 81 is formed on the portion 63a of the emitter lead electrode 63. Furthermore, a heat sink 91 is formed on the bump electrode 90.

When the vertical type construction transistor 40 having such a structure is operated, the heat is generated the most at a junction portion 47 between the emitter layer 43 and the base layer 42. The generated heat is transferred to the emitter lead electrode 63 formed above the emitter electrode 53 through the emitter electrode 53, and dissipated from the emitter lead electrode 63. The distance between the heat generating portion and the radiation portion is made shorter, so that, according to this structure, the generated heat can be dissipated more effectively compared with the conventional structure where the heat is dissipated from the reverse face side of the semiconductor substrate 30. In order to further improve the radiating efficiency, the emitter lead electrode 63 is preferably made of a metal excellent in thermal conductivity. For example, the emitter lead electrode 63 is preferably made of gold having thermal conductivity six times as large as that of GaAs. By forming the emitter lead electrode 63 from such a metal excellent in thermal conductivity, the generated heat can be dissipated more effectively, so that the thus obtained vertical type construction transistor 40 can preferably be used for power amplification use in the microwave band. In addition, since the emitter lead electrode 63 is held by the insulating film 70, it can have a greater strength than an electrode formed by using the conventional air-bridge method.

Moreover, with such a structure where the bump electrode 90 is formed on the portion 63a of the emitter lead electrode 63, the heat of the junction portion 47 can effectively be transferred to the bump electrode 90 through the emitter electrode 53 and the emitter lead electrode 63. Moreover, a heat sink may be flip-chip-bonded to the bump electrode 90 so that the radiating efficiency can be remarkably heightened. For further improving the radiating efficiency, the bump electrode 90 is preferably made of a metal excellent in thermal conductivity, for example, a metal including gold. In addition, the distance 1 from the emitter electrode 53 to the bump electrode 90 is desired to be minimized in order to heighten the radiating efficiency. For lowering the inductance, the thickness t of the emitter lead electrode 63 is desired to be made greater.

According to the present example, the distance 1 between the emitter electrode 53 to the bump electrode 90 is made short to be about 7 μm and the thickness of the emitter lead electrode 63 is made thick to be about 3 μm, so that the inductance of the emitter lead electrode 63 to be grounded can satisfactorily be lowered. Furthermore, since the bump electrode 90 is made of gold having higher thermal conductivity, the thermal resistance thereof can be lowered compared with that of a conventional bump electrode made of lead-tin alloy.

Since the emitter lead electrode 63 is extended out in an arched shape over the emitter electrode 53, both of the parasitic capacitance $C_{BE}$ between base/emitter and the parasitic capacitance $C_{CE}$ between collector/emitter are slightly increased, however the variations of these capacities have little influence on the properties of the resulting vertical type construction transistor 40 in the high frequency band. On the other hand, the parasitic capacitance $C_{BC}$ between base/collector has great influence on the properties of the vertical type construction transistor 40 in the high frequency band, but this capacitance $C_{BC}$ is little increased due to the above structure of the emitter lead electrode 63.

According to the structure shown in FIGS. 1 and 2, a plurality of vertical type construction transistors 40 can suitably be connected in parallel to each other. The collector lead electrode 61, the base lead electrode 62, and the emitter lead electrode 63 are each made as a common electrode for all the adjacent vertical type construction transistors 40. With such a structure, a number of vertical type construction transistors 40 can readily be connected in parallel to each other.

Figure 3:
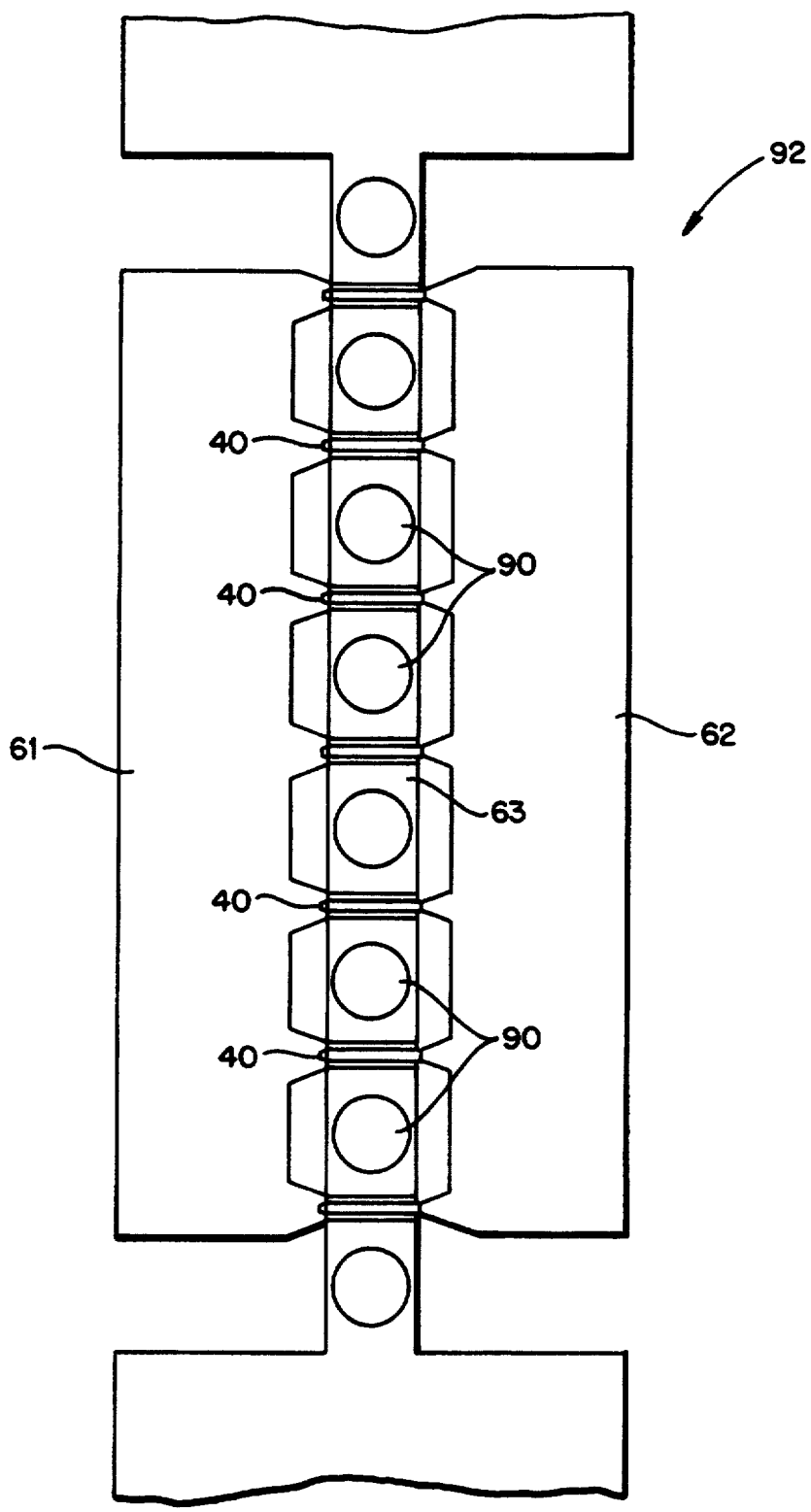
FIG. 3 is a plan view showing a structure for a semiconductor apparatus including a plurality of vertical type construction transistors according to the present invention.
Figure 4A:
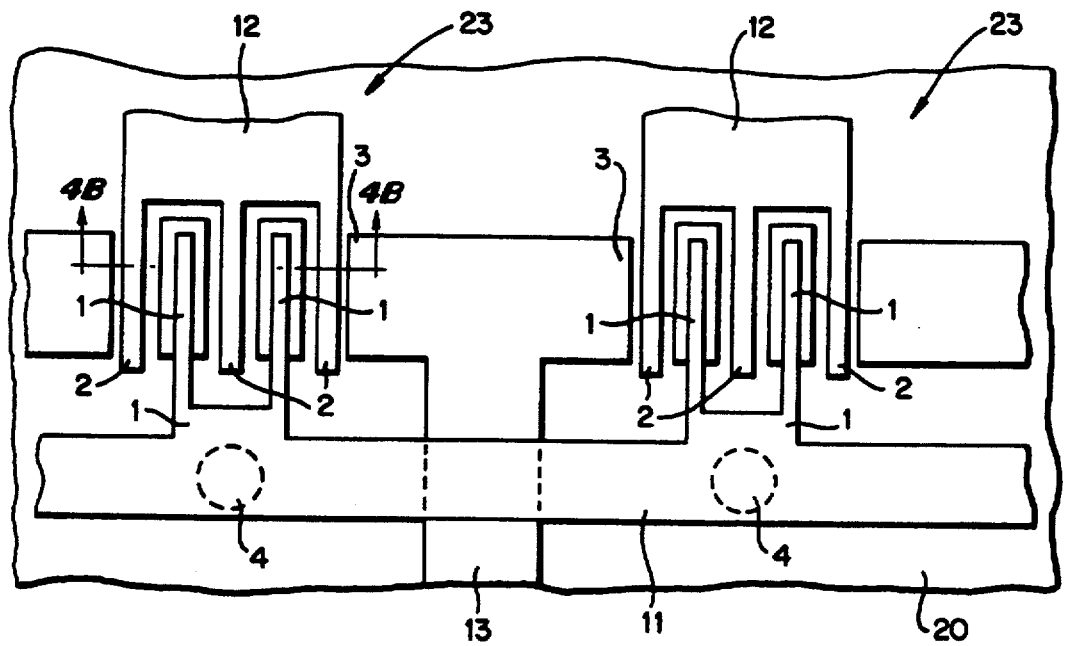
FIG. 4A is a plan view showing a structure for conventional vertical type construction transistors.
Figure 4B:
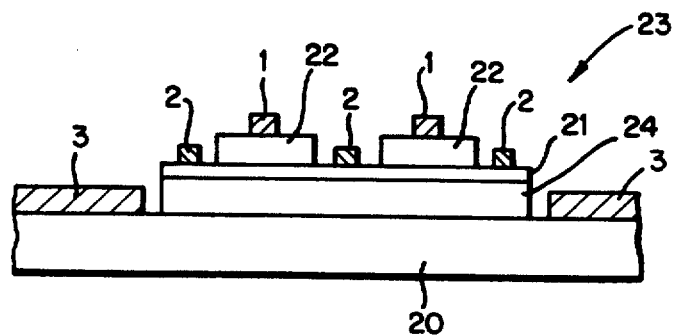
FIG. 4B is a cross-sectional view of FIG. 4A.
Figure 5:
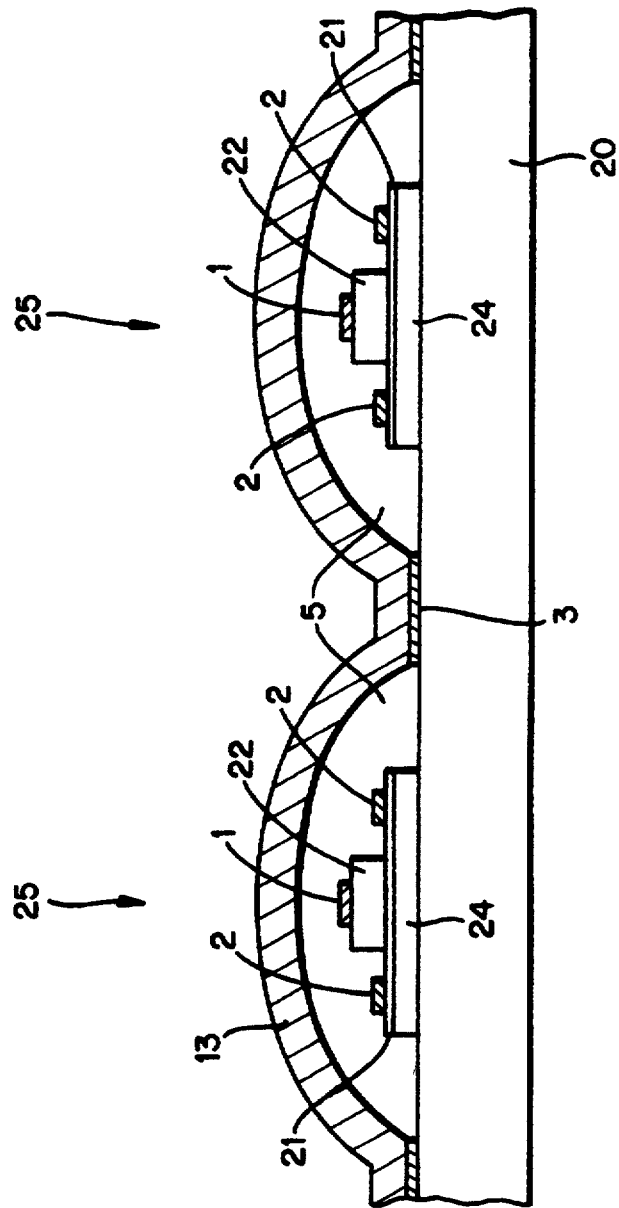
FIG. 5 is a cross-sectional view showing a structure for another conventional vertical type construction transistors.

FIG. 3 is a plan view showing a semiconductor device 92 including the plurality of vertical type construction transistors 40 according to the present invention. The emitter lead electrode 63 is formed in a direction normal to a first direction in which each finger-shaped electrode is extended, so that the plurality of vertical type construction transistors 40 formed in the direction normal to the first direction can be connected in parallel to each other. The emitter lead electrode 63 can be formed so as to be in parallel with the base lead electrode 62 and the collector lead electrode 61. The semiconductor device 92 having such a structure is preferably used as a Monolithic Microwave Integrated Circuit (MMIC) for power amplification use in the microwave band.

Hereinafter will be described a method for manufacturing the vertical type construction transistor 40 according to the present invention.

An AlGaAs/GaAs semiconductor multilayer 44 is formed on a semi-insulating GaAs substrate 30 by using a known procedure (as is described in, for example, Electronic Communication Society Technical Research Report ED90-135). The semiconductor multilayer 44 consists of a sub-collector layer 41a, a collector layer 41, a base layer 42, and an emitter layer 43. Furthermore, by using a known method, a collector electrode 51, a base electrode 52, and an emitter electrode 53 are formed on the sub-collector layer 41a, the base layer 42, and the emitter layer 43, respectively, so as to be extended in a finger-shape in a first direction.

An insulating film 70 made of photosensitive polyimide is formed so as to cover the semiconductor multilayer 44, the base electrode 52, and the collector electrode 51, and then a collector lead electrode 61 and a base lead electrode 62 are formed.

An opening 45 is provided above the emitter electrode 53, and an opening 46 is provided above part of the semiconductor substrate 30. Then, an emitter lead electrode 63 is formed so as to be extended out in an arched shape in a direction normal to the first direction so as to cover the openings 45 and 46. The emitter lead electrode 63 consists of a multi-layer film made of Ti/Pt/Au, and has a thickness of about 3 μm.

A silicon nitride film 66 is entirely formed as a passivation film on the entire surface of the semiconductor substrate 30. The silicon nitride film 66 has a circular shaped opening 65 above the portion 63a of the emitter lead electrode 63 provided within the opening 46. The opening 65 is situated at a distance of 7 μm from an edge of the emitter electrode 53 (1=7 μm). Then, a titanium layer (not shown) is entirely formed so as to cover the semiconductor substrate 30. A resist pattern (not shown) is formed so that a titanium film 80 within the opening 65 is exposed, and then a gold film 81 made of gold is formed by using a metallizing plating method, thereby forming a bump electrode 90 composed of the titanium film 80 and the gold film 81. Thereafter, the remaining resist pattern and the remaining titanium layer except for the titanium film 80 are removed.

A junction portion 47 between the emitter layer 43 and the base layer 42 where heat is generated the most is situated at a distance of about 7 μm from the bump electrode 90, but the junction portion 47 is connected to the bump electrode 90 through the emitter lead electrode 63. The emitter lead electrode 63 is made of a metal including gold having thermal conductivity six times as large as that of GaAs. Therefore, the heat generated at the junction portion 47 is effectively transferred to the bump electrode 90 through the emitter electrode 53 and the emitter lead electrode 63. By flip-chip-bonding a heat sink to the bump electrode 90, the radiating efficiency can remarkably be heightened.

According to the present example, the distance l between the emitter electrode 53 to the bump electrode 90 is made short to be about 7 μm and the thickness of the emitter lead electrode 63 is made thick to be about 3 μm, so that the inductance of the emitter lead electrode 63 to be grounded can satisfactorily be lowered. Furthermore, the bump electrode 90 is made of gold having higher thermal conductivity, the thermal resistance thereof can be lowered compared with that of a conventional bump electrode made of lead/tin alloy.

The emitter lead electrode 63 is extended out in an arched shape above the emitter electrode 53, so that both of the parasitic capacitance $C_{BE}$ between base/emitter and the parasitic capacitance $C_{CE}$ between collector/emitter are slightly increased, however the variations of these capacities have little influence on the properties of the vertical type construction transistor 40 in the high frequency band. On the other hand, the parasitic capacitance $C_{BC}$ between base/collector has great influence on the properties of the vertical type construction transistor 40 in the high frequency band, but this capacitance $C_{BC}$ is little increased due to the above structure of the emitter lead electrode 63.

Although the radiation from the reverse side of the semiconductor substrate 30 is not effected particularly in the above example, a radiating means may be provided on the reverse side of the semiconductor substrate 30 using a conventional Plated Heat Sink (PHS) method. Moreover, the radiation can be effected by way of using a heating solder, a case cap and so on. Furthermore, the bump electrode 90 to be connected to the heat sink may be provided on the base lead electrode 62 or the collector lead electrode 61. Alternatively, the bump electrode 90 may not be used as an electrode but used only to effect thermal radiation through the insulating film.

The semiconductor multilayer 44 may further include semiconductor layers other than the above-mentioned emitter layer 43, base layer 42, and collector layer 41, such as a contact layer for forming a non-alloy ohmic junction, or a buffer layer for reducing the leakage current. For example, an n-type GaAs layer may be interposed between the collector layer 41 and the semiconductor substrate 30, and/or an n-type GaAs layer or an n-type InGaAs layer may be formed above the emitter layer 43. When such a semiconductor layer is formed on the emitter layer 43, the emitter electrode 53 may be formed on the thus added semiconductor layer so as to be electrically connected to the emitter layer 43 through the added semiconductor layer.

In the above example, the present invention was described by using the AlGaAs/GaAs type transistor, but it is not limited to this type transistor. Needless to say, the other lattice matching type such as InGaAs/InAlAs type and InGaAs/InP type, or a lattice mismatching type such as InGaAs/AlGaAs type may also be used.

The parasitic capacitance $C_{BC}$ between base/collector may be reduced by the implantation of $O^+$, $B^+$, $H^+$ ions, etc. into the base layer 42 under the base electrode 52. Moreover, a separating construction among elements by an ion implantation can be employed.

The present invention is described herein referring to the emitter top type of vertical type construction transistor 40 where the collector layer 41, the base layer 42, and the emitter layer 43 are successively formed on the semiconductor substrate 30 in this order. However, the present invention is also applied to a collector top type of vertical type construction transistor 40 where the emitter layer 41, the base layer 42, and the collector layer 43 are successively formed on the semiconductor substrate 30 in this order. The collector top type of vertical type construction transistor 40 can be manufactured in accordance with the above-mentioned example except that "emitter" reads "collector" and vice versa, thereby obtaining the same effects. The vertical type construction transistor 40 of the present invention may be reversed from the npn-type to a pnp-type.

The present invention is not limited to the above vertical type construction transistor 40, but may also be applied to a single hetero bipolar transistor (SHBT) in which only the emitter layer 41 has a wide band gap, and a double hetero bipolar transistor (DHBT) in which the collector layer 43 also has a wide band gap. Moreover, any other vertical type construction transistors such as a hot electron transistor and a resonance tunnel transistor can be used as the transistor 40 of the present invention.

Some exemplary values for concentrations of impurities in semiconductor layers and other dimensions are mentioned above. It will be appreciated that other values which will enable operation of the invention described also may be used. Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A vertical type construction transistor comprising:
   a semiconductor substrate;
   a semiconductor multilayer formed on said semiconductor substrate, said semiconductor multilayer including at least an emitter layer, a collection layer, and a base layer;
   a first electrode electrically connected to said base layer;
   a second electrode electrically connected to one of said emitter layer and said collector layer;
   a third electrode formed on said semiconductor multilayer, and electrically connected to the other of said emitter layer and said collector layer, said third electrode being extended in a first direction;
   an insulating film covering substantially all but a first area of said semiconductor multilayer; and
   an overlay electrode at least partially formed on said insulating film, said overlay electrode being electrically connected to said third electrode at said first area, and extending out in a direction normal to said first direction so as to be in contact with said semiconductor substrate, said overlay electrode having a width similar to the length of said third electrode in said first direction.

2. A vertical type construction transistor according to claim 1, further comprising a bump electrode formed on said overlay electrode for being connected to a heat sink.

3. A vertical type construction transistor according to claim 1, wherein said overlay electrode is made of a material including gold.

4. A vertical type construction transistor according to claim 2, wherein said overlay electrode and said bump electrode are made of a material including gold.

5. A semiconductor device comprising:
a semiconductor substrate;
a plurality of vertical type construction transistors formed on said semiconductor substrate, each including:
a semiconductor multilayer formed on said semiconductor substrate, said semiconductor multilayer including at least an emitter layer, a collector layer, and a base layer,
a first electrode being electrically connected to said base layer,
a second electrode being electrically connected to one of said emitter layer and said collector layer,
a third electrode formed on said semiconductor multilayer, and electrically connected to the other of said emitter layer and said collector layer not being electrically connected to the second electrode, said third electrode being extended in a first direction, and
an insulating film covering substantially all but a first area of said semiconductor multilayer;
a first lead electrode formed on said semiconductor substrate for electrically connecting said first electrodes of said plurality of vertical type construction transistors to each other;
a second lead electrode formed on said semiconductor substrate for electrically connecting said second electrodes of said plurality of vertical type construction transistors to each other; and
an overlay electrode at least partially formed on said insulating film, said overlay electrode being electrically connected to said third electrode at said first area, at least partially formed on said insulating film, and extending out in a direction normal to said first direction so as to be in contact with said semiconductor substrate, said overlay electrode having a width similar to the length of said third electrode in said first direction, and said overlay electrode electrically connected to the third electrodes to more than one of said plurality of vertical type construction transistors.

6. A semiconductor device according to claim 5, wherein each of said plurality of vertical type construction transistors further comprises a bump electrode formed on said overlay electrode for being connected to a heat sink.

7. A semiconductor device according to claim 5, wherein said overlay electrode is made of a material including gold.

8. A semiconductor according to claim 6, wherein said overlay electrode and said bump electrode are made of a material including gold.

* * * * *

UNITED STATES PATENT AND TRADEMARK OFFICE
CERTIFICATE OF CORRECTION

PATENT NO.  : 5,373,185
DATED       : December 13, 1994
INVENTOR(S) : Hiroya Sato It is certified that error appears in the above-indentified patent and that said Letters Patent is hereby corrected as shown below:

Column 8, line 52, (claim 1, line 5) "collection" should read --collector--.

Signed and Sealed this

Ninth Day of May, 1995

Attest:

BRUCE LEHMAN

*Attesting Officer*  *Commissioner of Patents and Trademarks*